(12) United States Patent
Liu et al.

(10) Patent No.: US 12,713,738 B2
(45) Date of Patent: Aug. 18, 2026

(54) LED STRUCTURE AND GaN-BASED SUBSTRATE THEREOF, AND METHOD FOR MANUFACTURING GaN-BASED SUBSTRATE

(71) Applicant: ENKRIS SEMICONDUCTOR, INC., Suzhou (CN)

(72) Inventors: Weihua Liu, Suzhou (CN); Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 701 days.

(21) Appl. No.: 18/026,093

(22) PCT Filed: Nov. 11, 2020

(86) PCT No.: PCT/CN2020/128186

§ 371 (c)(1), (2) Date: Mar. 13, 2023

(87) PCT Pub. No.: WO2022/099519

PCT Pub. Date: May 19, 2022

(65) Prior Publication Data

US 2023/0335678 A1 Oct. 19, 2023

(51) Int. Cl.
*H01L 33/32* (2010.01)
*H10H 20/01* (2025.01)
(Continued)

(52) U.S. Cl.
CPC ...... *H10H 20/825* (2025.01); *H10H 20/0137* (2025.01); *H10H 20/819* (2025.01); *H10H 20/814* (2025.01)

(58) Field of Classification Search
CPC ............. H10H 20/825; H10H 20/0137; H10H 20/819; H10H 20/814; H10H 20/815; H10H 20/01335; H10H 20/8215
See application file for complete search history.

(56) References Cited

U.S. PATENT DOCUMENTS 7,968,361 B2 6/2011 Osawa et al.
9,837,494 B2 12/2017 Okuno et al.
(Continued)

FOREIGN PATENT DOCUMENTS

CN 1531757 A 9/2004
CN 101410992 A 4/2009
(Continued)

OTHER PUBLICATIONS

ISA State Intellectual Property Office of the People's Republic of China, International Search Report Issued in Application No. PCT/CN2020/128186, Aug. 10, 2021, WIPO, 4 pages.
(Continued)

*Primary Examiner* — Mohammed R Alam
(74) *Attorney, Agent, or Firm* — Carroll, Hoette & Butscher, LLC; Christopher R. Carroll

(57) ABSTRACT

The present application provides an LED structure and a GaN-based substrate thereof, and a method for manufacturing a GaN-based substrate. The GaN-based substrate includes: a patterned base including a plurality of depressions and a plurality of protrusions; a metal Ga layer located at the plurality of depressions; and a second semiconductor layer located on the metal Ga layer and the plurality of protrusions exposed by the metal Ga layer, where a material for the second semiconductor layer is a GaN-based material. When the LED light-emitting structure is formed on the GaN-based substrate, light emitted by the LED light-emitting structure, after being reflected via the metal Ga layer, can emit from an upper surface or a side surface of the LED light-emitting structure, which reduces the light absorption and further improves the light-emitting efficiency of the LED light-emitting structure.

10 Claims, 4 Drawing Sheets

(51) Int. Cl.

| | |
|---|---|
| ***H10H 20/819*** | (2025.01) |
| ***H10H 20/825*** | (2025.01) |
| *H10H 20/814* | (2025.01) |

(56) References Cited

U.S. PATENT DOCUMENTS

| | | | | |
|---|---|---|---|---|
| 2009/0114930 | A1 | 5/2009 | Kuo | |
| 2009/0114933 | A1 | 5/2009 | Osawa et al. | |
| 2010/0068866 | A1 | 3/2010 | Yu et al. | |
| 2013/0256743 | A1 | 10/2013 | Okuno et al. | |
| 2013/0277684 | A1 | 10/2013 | Araki et al. | |
| 2014/0134774 | A1* | 5/2014 | Chiu .................... | H10H 20/819 438/47 |
| 2019/0189843 | A1 | 6/2019 | Choi et al. | |

FOREIGN PATENT DOCUMENTS

| | | | |
|---|---|---|---|
| CN | 101504962 | A | 8/2009 |
| CN | 103367113 | A | 10/2013 |
| KR | 20050070854 | A | 7/2005 |
| KR | 20110032764 | A | 3/2011 |
| KR | 101035143 | B1 | 5/2011 |
| TW | 476913 | B | 3/2015 |

OTHER PUBLICATIONS

ISA State Intellectual Property Office of the People's Republic of China, Written Opinion of the International Searching Authority Issued in Application No. PCT/CN2020/128186, Aug. 10, 2021, WIPO, 4 pages.(Submitted with Machine/ Partial Translation).

TW Patent Office, Office Action Issued in Application No. 110141631, Jul. 21, 2022, 6 pages. (Submitted with Machine/Partial Translation).

State Intellectual Property Office of the People's Republic of China, Office Action and Search Report Issued in Application No. 2020801066298, Nov. 27, 2024, 8 pages. (Submitted with Machine Translation).

* cited by examiner

Provide a patterned base comprising a plurality of depressions and a plurality of protrusions; epitaxially growing a first semiconductor layer in the plurality of depressions, where a material for the first semiconductor layer is GaN — S1

Epitaxially grow a second semiconductor layer on the first semiconductor layer and the plurality of protrusions exposed by the first semiconductor layer, a material for the second semiconductor layer is a GaN-based material, the material for the second semiconductor layer is different from the material for the first semiconductor layer, and the second semiconductor layer has gaps, which penetrate through the second semiconductor layer in a thickness direction — S2

Introduce $H_2$ at a temperature higher than 300°C, where the $H_2$ reacts with the first semiconductor layer via the notches to generate a metal Ga layer — S3

FIG.1

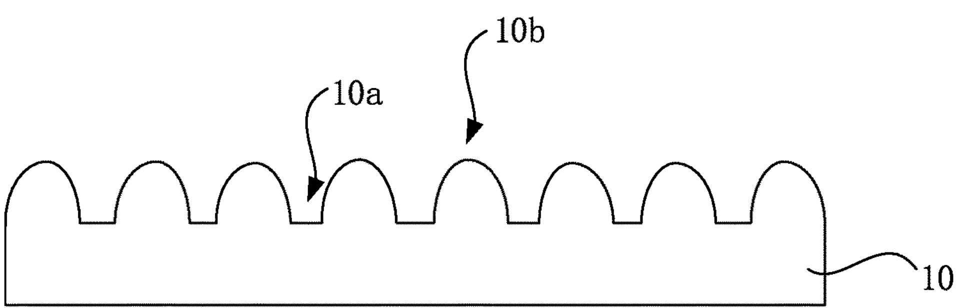

FIG.2

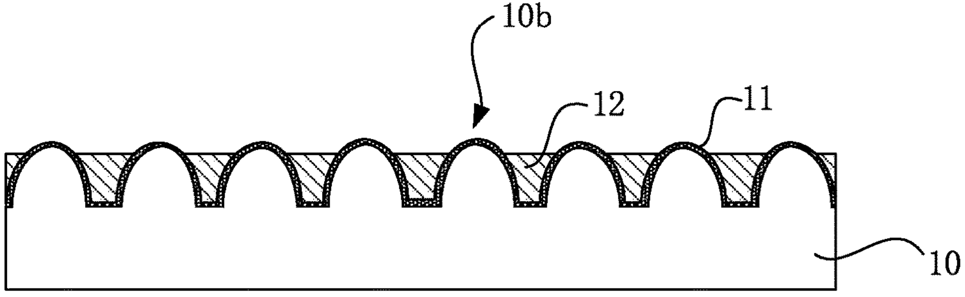

FIG.3

LED STRUCTURE AND GaN-BASED SUBSTRATE THEREOF, AND METHOD FOR MANUFACTURING GaN-BASED SUBSTRATE

CROSS REFERENCE TO RELATED APPLICATIONS

This application is a US National Phase of a PCT Application No. PCT/CN2020/128186 filed on Nov. 11, 2020, the entire contents of which are incorporated herein by reference in their entireties.

TECHNICAL FIELD

The present application relates to the field of semiconductor technologies, and in particular, to an LED structure and GaN-based substrate thereof, and a method for manufacturing a GaN-based substrate.

BACKGROUND

Group III nitrides are a third generation of novel semiconductor materials after first and second generations of semiconductor materials such as Si and GaAs. GaN, as a wide bandgap semiconductor material, has many advantages, such as high saturation and drift velocity, high breakdown voltage, excellent carrier transport performance and ability to form ternary alloys such as AlGaN, InGaN and quaternary alloys such as AlInGaN, which makes it easy to produce GaN-based PN junctions. In view of this, GaN-based materials and semiconductor devices have been extensively and deeply studied in recent years. Growing the GaN-based materials through metal-organic chemical vapor deposition (MOCVD) is increasingly mature. In the aspect of studying the semiconductor devices, studies of GaN-based LED (Light-emitting Diode), LD (Laser Diode) and other photoelectronic devices, GaN-based HEMT (high electron mobility transistor) and other microelectronic devices, etc. have gained remarkable achievements and rapid development.

As the application of GaN-based materials in light-emitting devices is gradually deepened, the demand for light-emitting efficiency of terminal products in an industry is further increased.

SUMMARY

A purpose of the present disclosure is to provide an LED structure and GaN-based substrate thereof, and a method for manufacturing a GaN-based substrate to improve the light-emitting efficiency of the LED structure.

In order to achieve the purpose, in a first aspect of the present disclosure, a GaN-based substrate is provided, including:

- a patterned base including a plurality of depressions and a plurality of protrusions;
- a metal Ga layer located at the plurality of depressions; and
- a second semiconductor layer located on the metal Ga layer and the plurality of protrusions exposed by the metal Ga layer, where a material for the second semiconductor layer is a GaN-based material.

Optionally, a first nucleation layer is provided between the plurality of depressions and the metal Ga layer and between the plurality of protrusions and the second semiconductor layer, and a material for the first nucleation layer is AlGaN or AlN.

Optionally, a third nucleation layer is provided between the plurality of protrusions and the second semiconductor layer, and a material for the third nucleation layer is AlGaN or AlN.

Optionally, the patterned base is a patterned sapphire base.

In a second aspect of the present disclosure, an LED structure is provided, including:

- a GaN-based substrate as described above;
- an LED light-emitting structure located on the GaN-based substrate and including a semiconductor layer of a first conductive type, a semiconductor layer of a second conductive type, and a light-emitting layer located between the semiconductor layer of the first conductive type and the semiconductor layer of the second conductive type, where the first conductive type is opposite to the second conductive type.

In a third aspect of the present disclosure, a method of manufacturing a GaN-based substrate is provided, including:

- providing a patterned base including a plurality of depressions and a plurality of protrusions, where a first semiconductor layer is epitaxially grown in the plurality of depressions, and a material for the first semiconductor layer is GaN;
- epitaxially growing a second semiconductor layer on the first semiconductor layer and the plurality of protrusions exposed by the first semiconductor layer, where a material for the second semiconductor layer is a GaN-based material, the material for the second semiconductor layer is different from the material of the first semiconductor layer, and the second semiconductor layer has gaps, which penetrate through the second semiconductor layer in a thickness direction;
- introducing $H_2$ at a temperature higher than 300° C., where $H_2$ reacts with the first semiconductor layer via the gaps to generate a metal Ga layer.

Optionally, the material for the second semiconductor layer is AlGaN or AlN.

Optionally, before the first semiconductor layer is epitaxially grown, a first nucleation layer is grown on the patterned base in the same shape as the patterned base, where a material for the first nucleation layer is AlGaN or AlN; the first semiconductor layer and the second semiconductor layer are epitaxially grown on the first nucleation layer.

Optionally, before the first semiconductor layer is epitaxially grown, a second nucleation layer is grown on the patterned base at a low temperature, and the second nucleation layer is located on the patterned base in the same shape as the patterned base, where a material for the second nucleation layer is GaN; the first semiconductor layer is epitaxially grown on the second nucleation layer at the plurality of depressions; the second semiconductor layer is epitaxially grown upwards firstly on the first semiconductor layer, then the second semiconductor layer is laterally coalesced on the plurality of protrusions exposed by the first semiconductor layer, and thereafter, the second semiconductor layer is epitaxially grown upwards in the form of an entire surface.

Optionally, the patterned base is a patterned sapphire base.

In a fourth aspect of the present disclosure, a method of manufacturing a GaN-based substrate is provided, including:

- providing a patterned base including a plurality of depressions and a plurality of protrusions, where a first semiconductor layer is epitaxially grown in the plurality of depressions, and a material for the first semiconductor layer is GaN;

introducing $H_2$ at a temperature higher than 300° C., where $H_2$ reacts with the first semiconductor layer to generate a metal Ga layer;

performing epitaxial growth on the plurality of protrusions exposed by the metal Ga layer to form a second semiconductor layer covering an entire surface of the metal Ga layer, where a material for the second semiconductor layer is a GaN-based material.

Optionally, the material for the second semiconductor layer is AlGaN or AlN.

Optionally, before the first semiconductor layer is epitaxially grown, a first nucleation layer is grown on the patterned base, and the first nucleation layer is located on the patterned base in the same shape as the patterned base, where a material for the first nucleation layer is AlGaN or AlN; the first semiconductor layer and the second semiconductor layer are epitaxially grown on the first nucleation layer.

Optionally, before the first semiconductor layer is epitaxially grown, a second nucleation layer is grown on the patterned base at a low temperature, and the second nucleation layer is located on the patterned base in the same shape as the patterned base, where a material for the second nucleation layer is GaN; the first semiconductor layer is epitaxially grown on the second nucleation layer at the plurality of depressions;

after the first semiconductor layer reacts to generate the metal Ga layer, a third nucleation layer is grown on the plurality of protrusions exposed by the metal Ga layer, where a material for the third nucleation layer is AlGaN or AlN; the second semiconductor layer is epitaxially grown on the third nucleation layer.

Optionally, the patterned base is a patterned sapphire base.

BRIEF DESCRIPTION OF THE DRAWINGS

FIG. 1 is a flowchart illustrating a method for manufacturing a GaN-based substrate according to a first example of the present disclosure.

FIGS. 2 to 4 are schematic diagrams illustrating intermediate structures corresponding to processes in FIG. 1.

DETAILED DESCRIPTION OF THE EMBODIMENTS

In order to make the purposes, features and advantages of the present disclosure more apparent and understandable, the specific examples of the present disclosure will be described in detail below with reference to the accompanying drawings.

Figure 4:
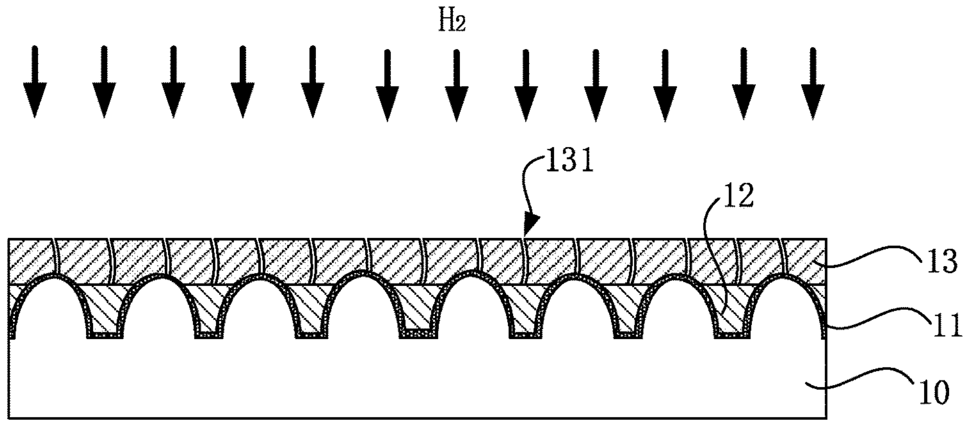
Figure 5:
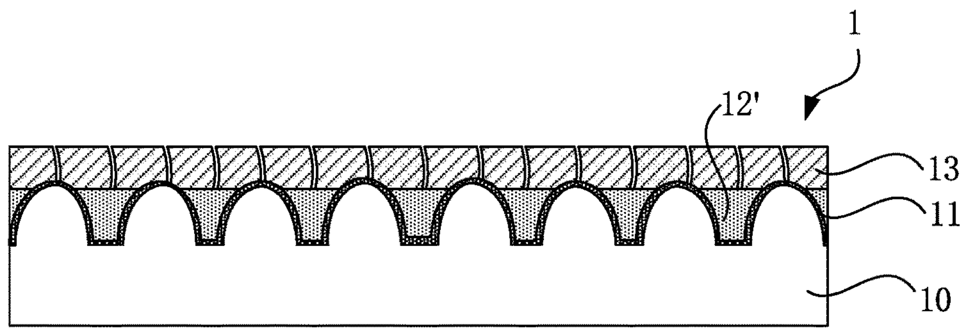
FIG. 5 is a schematic diagram illustrating a sectional structure of the GaN-based substrate in the first example of the present disclosure.

FIG. 1 is a flowchart illustrating a method for manufacturing a GaN-based substrate according to a first example of the present disclosure. FIGS. 2 to 4 are schematic diagrams illustrating intermediate structures corresponding to processes in FIG. 1. FIG. 5 is a schematic diagram illustrating a sectional structure of the GaN-based substrate in the first example of the present disclosure.

First, referring to step S1 in FIG. 1 and FIGS. 2 and 3, a patterned base 10 is provided, and the patterned base 10 includes a plurality of depressions 10*a* and a plurality of protrusions 10*b*, where a first semiconductor layer 12 is epitaxially grown in the plurality of depressions 10*a*, and a material for the first semiconductor layer 12 is GaN.

A material for the patterned base 10 may be sapphire, silicon carbide, silicon, silicon on insulator (SOI), lithium niobate, diamond, or other material.

In this example, referring to FIG. 2, before the first semiconductor layer 12 is epitaxially grown, a first nucleation layer 11 is grown on the patterned base 10, and the first nucleation layer 11 is located on the patterned base 10 in the same shape as the patterned base 10. A material for the first nucleation layer 11 is AlGaN or AlN.

The first nucleation layer 11 may consist of a) a low temperature nucleation layer, or of b) a firstly formed low temperature nucleation layer, and a high temperature nucleation layer formed on the low temperature nucleation layer. Compared with the solution a), the solution b) can reduce the defect density and material stress of the semiconductor layer subsequently epitaxially grown on the first nucleation layer 11, thereby improving the quality.

Epitaxial growth techniques of the first semiconductor layer 12 may include: atomic layer deposition (ALD), chemical vapor deposition (CVD), molecular beam epitaxy (MBE), plasma enhanced chemical vapor deposition (PECVD), low pressure chemical vapor deposition (LPCVD), metal-organic chemical vapor deposition (MOCVD), and a combination thereof.

For example, when the first semiconductor layer 12 is epitaxially grown through MOCVD, a metal source may be trimethyl gallium (TMGa), an N source may be $NH_3$, a carrier gas may be $H_2$, and a temperature may be higher than 300° C., optionally, higher than 700° C.

Next, referring to step S2 in FIG. 1 and FIG. 4, a second semiconductor layer 13 is epitaxially grown on the first semiconductor layer 12 and the plurality of protrusions 10*b* exposed by the first semiconductor layer 12. A material for the second semiconductor layer 13 is a GaN-based material, and the material for the second semiconductor layer 13 is different from the material for the first semiconductor layer 12. The second semiconductor layer 13 has gaps 131, which penetrate through the second semiconductor layer 13 in a thickness direction.

The material for the second semiconductor layer 13 may be at least one of AlN, InN, AlGaN, InGaN, AlInN or AlInGaN.

For epitaxial growth techniques of the second semiconductor layer 13, reference may be made to that of the first semiconductor layer 12. For example, when the second semiconductor layer 13 is epitaxially grown through MOCVD, a metal source may be trimethyl gallium (TMGa) and trimethyl aluminum (TMAl), an N source may be $NH_3$, a carrier gas may be $H_2$, and a temperature may be higher than 300° C., optionally, higher than 700° C.

Since the material for the second semiconductor layer 13 is different from the material for the first semiconductor layer 11, there are lattice mismatch and other problems existing between the second semiconductor layer 13 and the first semiconductor layer 12, which causes that the gaps 131 are formed in the second semiconductor layer 13.

Then, referring to step S3 in FIG. 1 and FIGS. 4 and 5, $H_2$ is introduced at a temperature higher than 300° C., and $H_2$ reacts with the first semiconductor layer 12 via the gaps 131 to generate a metal Ga layer 12'.

At a high temperature, for example, when the temperature is higher than 300° C., a chemical equation for the reaction between $H_2$ and the first semiconductor layer 12 is:

$$3H_2+2GaN=2Ga(l)+2NH_3\uparrow.$$

It should be noted that a temperature for the reaction between $H_2$ and the first semiconductor layer 12 should be lower than a boiling point of Ga.

The provision of the high temperature and introduction of $H_2$ may be implemented by stopping feeding the metal source and N source for epitaxial growth of the second semiconductor layer 13 and feeding only the carrier gas. The advantages are that: these operations can be carried out in a same reaction chamber, instead of being transferred between chambers, which can avoid the introduction of pollution during the transfer, and further avoid a secondary heating process, so as to improve the manufacturing efficiency.

The metal Ga layer 12' has a reflective property. Since $H_2$ does not react with the second semiconductor layer 13, the gaps 131 are used in this example to manufacture a reflective layer between the second semiconductor layer 13 and the patterned base 10.

FIG. 5 is a schematic diagram illustrating a sectional structure of the GaN-based substrate in the first example of the present disclosure.

Referring to FIG. 5, the GaN-based substrate 1 in this example includes:

a patterned base 10 including a plurality of depressions 10*a* and a plurality of protrusions 10*b* (see FIG. 2);

a metal Ga layer 12' located at the plurality of depressions 10*a*; and a second semiconductor layer 13 located on the metal Ga layer 12' and the plurality of protrusions 10*b* exposed by the metal Ga layer 12', where a material for the second semiconductor layer 13 is a GaN-based material.

A material for the patterned base 10 may be sapphire, silicon carbide, silicon, silicon on insulator (SOI), lithium niobate, diamond, or other material.

The material for the second semiconductor layer 13 may be at least one of AlN, InN, AlGaN, InGaN, AlInN or AlInGaN.

A first nucleation layer 11 is provided between the plurality of depressions 10*a* and the metal Ga layer 12' and between the plurality of protrusions 10*b* and the second semiconductor layer 13. A material for the first nucleation layer 11 is AlGaN or AlN.

Figure 6:
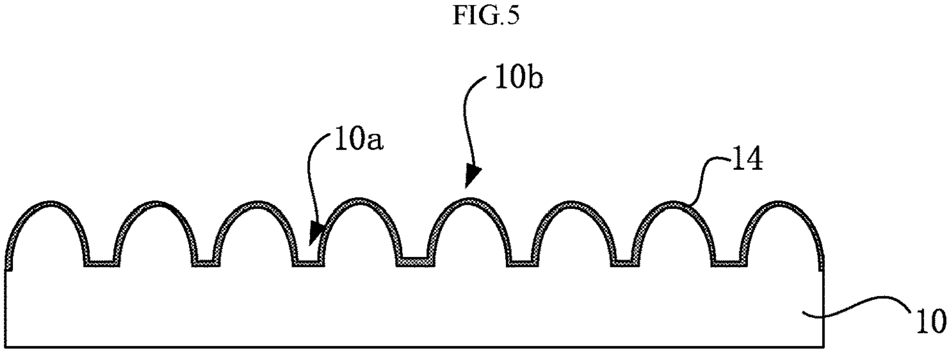
FIGS. 6 and 7 are schematic diagrams illustrating intermediate structures corresponding to a method for manufacturing a GaN-based substrate according to a second example of the present disclosure.
Figure 7:
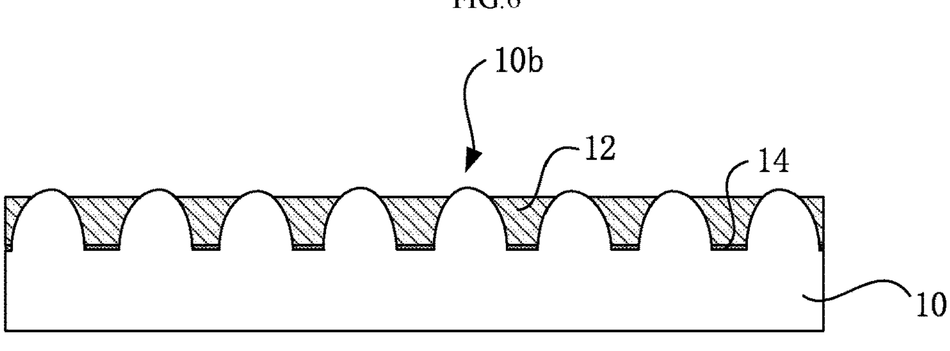
Figure 8:
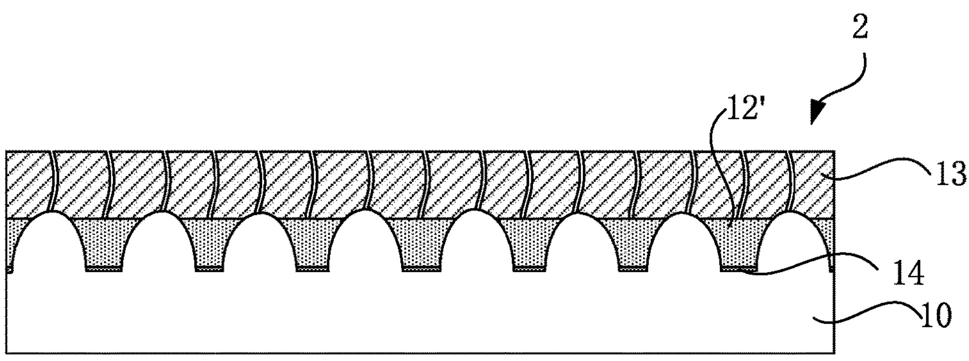
FIG. 8 is a schematic diagram illustrating a sectional structure of the GaN-based substrate in the second example of the present disclosure.

FIGS. 6 and 7 are schematic diagrams illustrating intermediate structures corresponding to a method for manufacturing a GaN-based substrate according to a second example of the present disclosure. FIG. 8 is a schematic diagram illustrating a sectional structure of the GaN-based substrate in the second example of the present disclosure.

Referring to FIGS. 6 to 8, the method for manufacturing the GaN-based substrate 2 in the second example is roughly the same as the method for manufacturing the GaN-based substrate 1 in the first example, except that:

in step S1, referring to FIG. 6, before the first semiconductor layer 12 is epitaxially grown, a second nucleation layer 14 is grown on the patterned base 10 at a low temperature, and the second nucleation layer 14 is located on the patterned base 10 in the same shape as the patterned base 10. A material for the second nucleation layer 14 is GaN.

Referring to FIG. 7, since the epitaxial growth of the first semiconductor layer 12 is a high temperature manufacturing process, the second nucleation layer 14 grown at a low temperature will be heated to crystallize again, and the second nucleation layer 14 on the protruded arc surfaces, especially, the second nucleation layer 14 on top surfaces of the plurality of protrusions 10*b*, will slide to upper surfaces of the plurality of depressions 10*a*. In this way, in the step S2, referring to FIG. 8, the second semiconductor layer 13 is epitaxially grown upwards firstly on the first semiconductor layer 12; then the second semiconductor layer 13 is laterally coalesced on the plurality of protrusions 10*b* exposed by the first semiconductor layer 12; and thereafter, the second semiconductor layer 13 is epitaxially grown upwards in the form of an entire surface.

Figure 9:
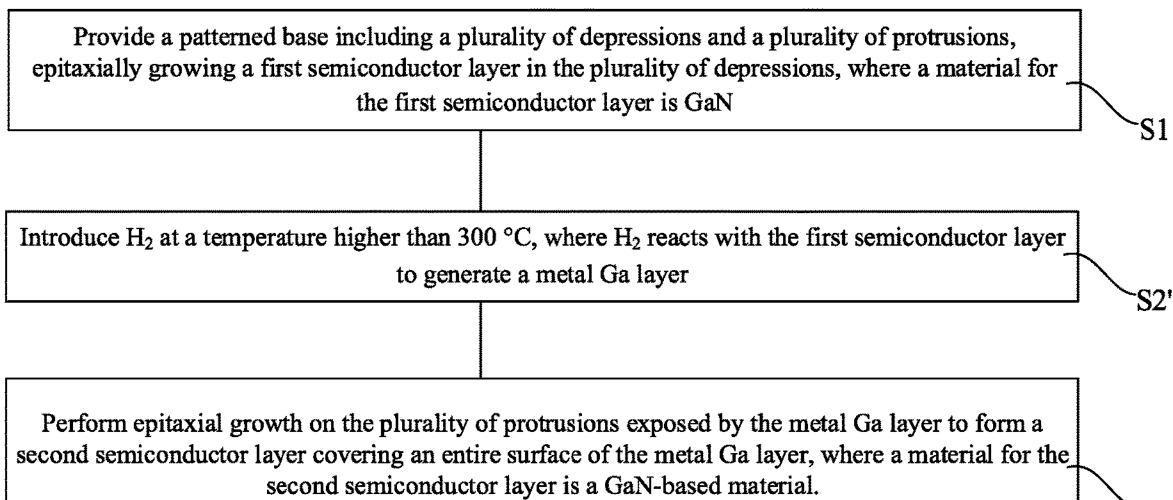
FIG. 9 is a flowchart illustrating a method for manufacturing a GaN-based substrate according to a third example of the present disclosure.
Figure 10:
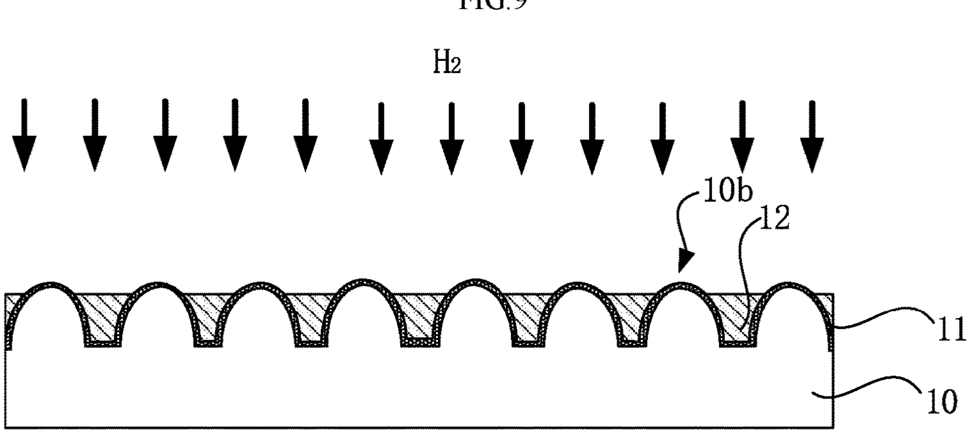
FIG. 10 is a schematic diagram illustrating an intermediate structure corresponding to processes in FIG. 9.
Figure 11:
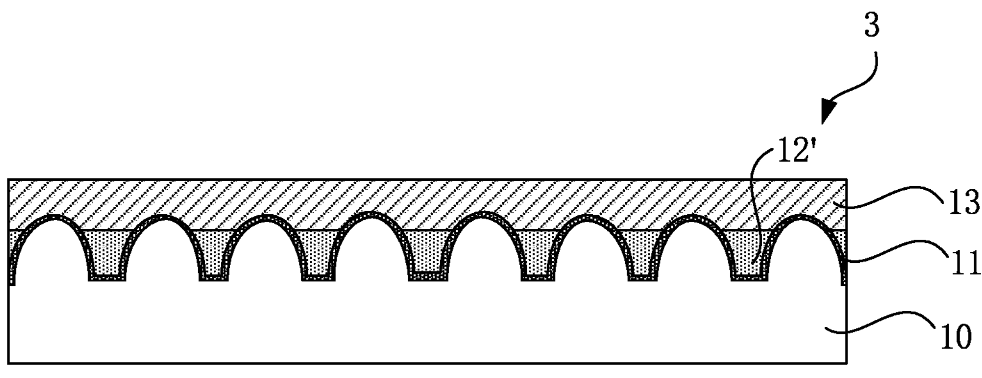
FIG. 11 is a schematic diagram illustrating a sectional structure of the GaN-based substrate in the third example of the present disclosure.

FIG. 9 is a flowchart illustrating a method for manufacturing a GaN-based substrate according to a third example of the present disclosure. FIG. 10 is a schematic diagram illustrating an intermediate structure corresponding to processes in FIG. 9. FIG. 11 is a schematic diagram illustrating a sectional structure of the GaN-based substrate in the third example of the present disclosure.

Referring to FIG. 9, the method for manufacturing the GaN-based substrate 3 in the third example is roughly the same as the method for manufacturing the GaN-based substrate 1 in the first example, except that:

in step S2', referring to FIG. 10, when the temperature is higher than 300° C., $H_2$ is introduced, and $H_2$ reacts with the first semiconductor layer 12 to generate the metal Ga layer 12';

in step S3', referring to FIG. 11, epitaxial growth is performed on the plurality of protrusions 10*b* exposed by the metal Ga layer 12' to form the second semiconductor layer 13 covering the entire surface of the metal Ga layer 12', and the material for the second semiconductor layer 13 is a GaN-based material.

Specifically, for reaction conditions of step S2', reference may be made to that of step S3 in the previous examples.

In step S3', since the first nucleation layer 11 is grown on the patterned base 10 before the first semiconductor layer 12 is epitaxially grown, the second semiconductor layer 13 is epitaxially grown upwards firstly on the first nucleation layer 11; then the second semiconductor layer 13 is laterally coalesced on the metal Ga layer 12'; and thereafter, the second semiconductor layer 13 is epitaxially grown upwards in the form of an entire surface.

Correspondingly, referring to FIG. 11, the GaN-based substrate 3 in the third example is roughly the same as the GaN-based substrate 1 in the first example.

Figure 12:
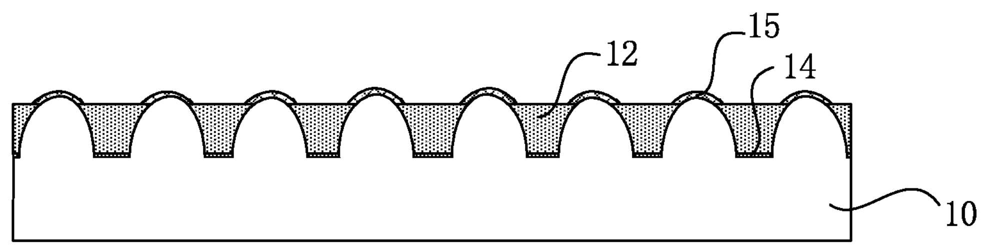
FIG. 12 is a schematic diagram illustrating an intermediate structure corresponding to a method for manufacturing a GaN-based substrate according to a fourth example of the present disclosure.
Figure 13:
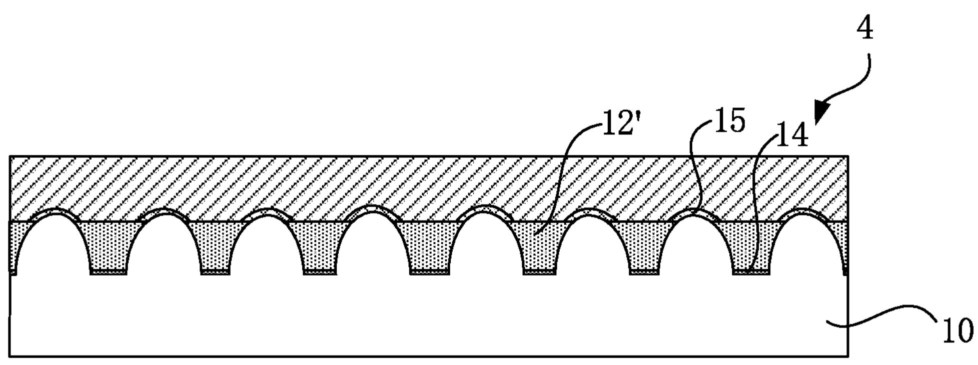
FIG. 13 is a schematic diagram illustrating a sectional structure of the GaN-based substrate in the fourth example of the present disclosure.

FIG. 12 is a schematic diagram illustrating an intermediate structure corresponding to a method for manufacturing a GaN-based substrate according to a fourth example of the present disclosure. FIG. 13 is a schematic diagram illustrating a sectional structure of the GaN-based substrate in the fourth example of the present disclosure.

Referring to FIG. 12, the method for manufacturing the GaN-based substrate 4 in the fourth example is roughly the same as the method for manufacturing the GaN-based substrate 3 in the third example, except that:

in step S1', before the first semiconductor layer 12 is epitaxially grown, the second nucleation layer 14 is grown on the patterned base 10 at a low temperature, and the second nucleation layer 14 is located on the patterned base 10 in the same shape as the patterned base 10. The material for the second nucleation layer 14 is GaN.

Since the epitaxial growth of the first semiconductor layer 12 is a high temperature manufacturing process, the second nucleation layer 14 grown at a low temperature will be heated to crystallize again, and the second nucleation layer 14 on protruded arc surfaces, especially, the second nucleation layer 14 on top surfaces of the plurality of protrusions 10*b*, will slide to upper surfaces of the plurality of depressions 10*a*. In this way, in step S3', a third nucleation layer 15 is grown on the plurality of protrusions 10*b* exposed by the metal Ga layer 12', and a material for the third nucleation layer 15 is AlGaN or AlN; the second semiconductor layer 13 is epitaxially grown upwards firstly on the third nucleation layer 15; then the second semiconductor layer 13 is laterally coalesced on the Metal Ga layer 12'; and thereafter, the second semiconductor layer 13 is epitaxially grown upwards in the form of an entire surface.

The third nucleation layer 15 can be grown on the metal Ga layer 12' and the plurality of protrusions 10*b* exposed by the metal Ga layer 12' in the form of an entire surface. Since the metal Ga layer 12' is in a liquid state at a high temperature, the second semiconductor layer 13 is epitaxially grown upwards firstly on the third nucleation layer 15 on the plurality of protrusions 10*b*.

Figure 14:
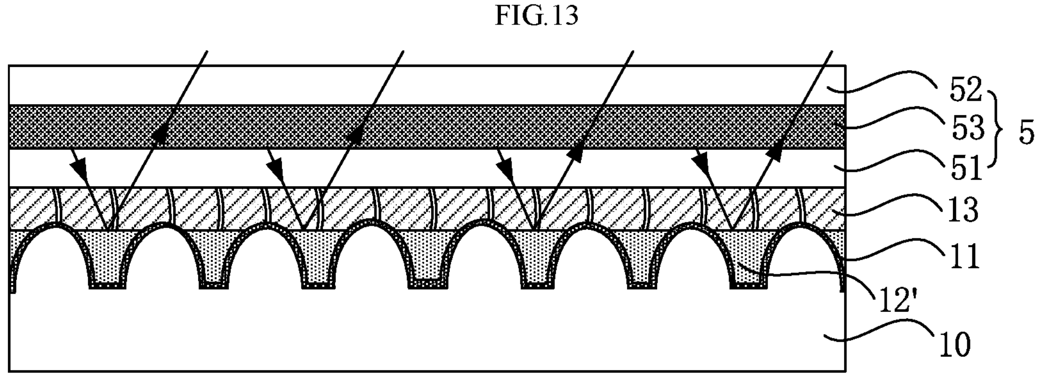
FIG. 14 is a schematic diagram illustrating a sectional structure of an LED structure according to a fifth example of the present disclosure.

FIG. 14 is a schematic diagram illustrating a sectional structure of an LED structure according to a fifth example of the present disclosure.

Referring to FIG. 14, the LED structure includes:

a GaN-based substrate 1, 2, 3 or 4 according to any one of the above examples;

an LED light-emitting structure 5 located on the GaN-based substrate 1, 2, 3 or 4 and including a semiconductor layer of a first conductive type 51, a semiconductor layer of a second conductive type 52, and a light-emitting layer 53 located between the semiconductor layer of the first conductive type 51 and the semiconductor layer of the second conductive type 52. The first conductive type is opposite to the second conductive type.

Materials for the semiconductor layer of the first conductive type 51, the light-emitting layer 53, and the semiconductor layer of the second conductive type 52 may be group III-V compounds, for example, a GaN-based material.

The light-emitting layer 53 may include at least one of a single quantum well structure, a multiple quantum well (MQW) structure, a quantum wire structure, or a quantum dot structure. The light-emitting layer may include a well layer and a barrier layer.

Referring to FIG. 14, light emitted by the LED light-emitting structure 5, after being reflected via the metal Ga layer 12', can emit from an upper surface or a side surface of the LED light-emitting structure 5, which reduces the light absorption and further improves the light-emitting efficiency of the LED light-emitting structure 5.

Compared with the prior art, the present disclosure has the following beneficial effects:

1) By processing the first semiconductor layer between the patterned base and the second semiconductor layer made of a GaN-based material, the first semiconductor layer is converted into the metal Ga layer, so as to form the GaN-based substrate. When the LED light-emitting structure is formed on the GaN-based substrate, light emitted by the LED light-emitting structure, after being reflected via the metal Ga layer, light can emit from an upper surface or a side surface of the LED light-emitting structure, which reduces the light absorption and further improves the light-emitting efficiency of the LED light-emitting structure.

2) In an optional solution, after the first semiconductor layer made of GaN and the second semiconductor layer made of a GaN-based material are sequentially formed on the patterned base, H2 reacts with the first semiconductor layer made of GaN through the gaps in the second semiconductor layer to generate the metal Ga layer. Or 3) In an optional solution, after the first semiconductor layer made of GaN is formed on the patterned base, H2 is introduced, so that H2 reacts with the first semiconductor layer made of GaN to generate the metal Ga layer, and then the second semiconductor layer made of a GaN-based material covering the entire surface of the metal Ga layer is epitaxially grown on the protrusions of the patterned base. The two method processes are simple and reliable.

Although the present disclosure is disclosed as above, it is not limited thereto. Any person skilled in the art can make various changes and modifications without departing from the spirit and scope of the present disclosure. Therefore, the protection scope of the present disclosure shall be based on the scope defined in the claims.

The invention claimed is:

1. A method of manufacturing a GaN-based substrate, comprising:

providing a patterned base comprising a plurality of depressions and a plurality of protrusions;

epitaxially growing a first semiconductor layer in the plurality of depressions, wherein a material for the first semiconductor layer is GaN;

epitaxially growing a second semiconductor layer on the first semiconductor layer and the plurality of protrusions exposed by the first semiconductor layer, wherein a material for the second semiconductor layer is a GaN-based material, the material for the second semiconductor layer is different from the material for the first semiconductor layer, and the second semiconductor layer has gaps, which penetrate through the second semiconductor layer in a thickness direction; and introducing $H_2$ at a temperature higher than 300° C., wherein $H_2$ reacts with the first semiconductor layer via the gaps to generate a metal Ga layer only made of Ga.

2. The method of manufacturing the GaN-based substrate according to claim 1, wherein the material for the second semiconductor layer is AlGaN or AlN.

3. The method of manufacturing the GaN-based substrate according to claim 1, wherein, before the first semiconductor layer is epitaxially grown, the method further comprising:

growing a first nucleation layer on the patterned base in the same shape as the patterned base, wherein a material for the first nucleation layer is AlGaN or AlN; and the first semiconductor layer and the second semiconductor layer are epitaxially grown on the first nucleation layer.

4. The method of manufacturing the GaN-based substrate according to claim 3, wherein, before the first semiconductor layer is epitaxially grown, the method further comprising:

growing a second nucleation layer on the patterned base at a low temperature, wherein the second nucleation layer is located on the patterned base in the same shape as the patterned base; a material for the second nucleation layer is GaN; the first semiconductor layer is epitaxially grown on the second nucleation layer at the plurality of depressions; the second semiconductor layer is epitaxially grown upwards firstly on the first semiconductor layer, then the second semiconductor layer is laterally coalesced on the plurality of protrusions exposed by the first semiconductor layer, and thereafter, the second semiconductor layer is epitaxially grown upwards in the form of an entire surface.

5. The method of manufacturing the GaN-based substrate according to claim 1, wherein the patterned base is a patterned sapphire base.

6. A method of manufacturing a GaN-based substrate, comprising:

providing a patterned base comprising a plurality of depressions and a plurality of protrusions;

epitaxially growing a first semiconductor layer in the plurality of depressions, wherein a material for the first semiconductor layer is GaN;

introducing $H_2$ at a temperature higher than 300° C., wherein $H_2$ reacts with the first semiconductor layer to generate a metal Ga layer only made of Ga; and performing epitaxial growth on the plurality of protrusions exposed by the metal Ga layer to form a second semiconductor layer covering an entire surface of the metal Ga layer, wherein a material for the second semiconductor layer is a GaN-based material.

7. The method of manufacturing the GaN-based substrate according to claim 6, wherein the material for the second semiconductor layer is AlGaN or AlN.

8. The method of manufacturing the GaN-based substrate according to claim 6, wherein, before the first semiconductor layer is epitaxially grown, the method further comprising:

growing a first nucleation layer on the patterned base in the same shape as the patterned base, wherein a material for the first nucleation layer is AlGaN or AlN; the first semiconductor layer and the second semiconductor layer are epitaxially grown on the first nucleation layer.

9. The method of manufacturing the GaN-based substrate according to claim 6, wherein, before the first semiconductor layer is epitaxially grown, the method further comprising:

growing a second nucleation layer on the patterned base at a low temperature, wherein the second nucleation layer is located on the patterned base in the same shape as the patterned base; a material for the second nucleation layer is GaN; the first semiconductor layer is epitaxially grown on the second nucleation layer at the plurality of depressions;

wherein after the first semiconductor layer reacts to generate the metal Ga layer, the method further comprising:

growing a third nucleation layer on the plurality of protrusions exposed by the metal Ga layer, wherein a material for the third nucleation layer is AlGaN or AlN; and the second semiconductor layer is epitaxially grown on the third nucleation layer.

10. The method of manufacturing the GaN-based substrate according to claim 6, wherein the patterned base is a patterned sapphire base.

* * * * *